(12) United States Patent
Jheng

(10) Patent No.: US 12,193,190 B2
(45) Date of Patent: Jan. 7, 2025

(54) HEAT SINK AND HEAT DISSIPATION DEVICE

(71) Applicant: COOLER MASTER CO., LTD., Taipei (TW)

(72) Inventor: Yan-Sian Jheng, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 0 days.

(21) Appl. No.: 18/404,736

(22) Filed: Jan. 4, 2024

(65) Prior Publication Data

US 2024/0147670 A1    May 2, 2024

Related U.S. Application Data

(62) Division of application No. 17/167,041, filed on Feb. 3, 2021, now Pat. No. 11,910,569.

(30) Foreign Application Priority Data

Dec. 2, 2020 (TW) ................................. 109215924

(51) Int. Cl.
*H05K 7/20* (2006.01)
*G06F 1/20* (2006.01)

(52) U.S. Cl.
CPC ....... *H05K 7/2039* (2013.01); *H05K 7/20154* (2013.01); *G06F 1/20* (2013.01)

(58) Field of Classification Search
CPC ..... H05K 7/2039; H05K 7/20154; G06F 1/20
USPC ...................................................... 165/80.3
See application file for complete search history.

(56) References Cited

U.S. PATENT DOCUMENTS

| | | | | |
|---|---|---|---|---|
| 5,597,034 A * | 1/1997 | Barker, III | ............ | H01L 23/467 174/16.3 |
| 6,336,499 B1 * | 1/2002 | Liu | ........ | H01L 23/467 165/125 |
| 6,633,484 B1 * | 10/2003 | Lee | ...... | H01L 23/3672 257/722 |
| D500,745 S * | 1/2005 | Duan | .......... | D13/179 |
| 6,886,627 B2 * | 5/2005 | Kozyra | ................. | H01L 23/467 165/185 |
| 6,927,979 B2 * | 8/2005 | Watanabe | ............. | H01L 23/467 257/722 |
| 7,055,578 B2 * | 6/2006 | Ku | ........ | H01L 23/467 165/122 |
| 7,113,403 B2 * | 9/2006 | Kuo | ...... | H01L 23/467 257/722 |
| 7,230,828 B2 * | 6/2007 | Lee | ...... | H01L 23/4006 257/E23.099 |
| 7,493,940 B2 * | 2/2009 | Chen | ...... | H01L 23/467 165/80.3 |
| 7,532,472 B2 * | 5/2009 | Lin | ........ | H01L 23/467 361/709 |

(Continued)

*Primary Examiner* — Claire E Rojohn, III
(74) *Attorney, Agent, or Firm* — Maschoff Brennan

(57) ABSTRACT

A heat sink is provided. The heat sink includes a cylindrical body and a plurality of fins. The fins are connected to and protruding from the cylindrical body. At least a part of the plurality of fins each include a first protrusion portion and a second protrusion portion, a distal edge of the first protrusion portion is located farther away from a central axis of the cylindrical body than a distal edge of the second protrusion portion. In addition, the disclosure also provides a heat dissipation device having the heat sink.

14 Claims, 9 Drawing Sheets

(56) References Cited

U.S. PATENT DOCUMENTS

| | | | | |
|---|---|---|---|---|
| D600,218 S * | 9/2009 | Otsuki | | D13/179 |
| 7,589,967 B2 * | 9/2009 | Zhou | | H01L 23/4006 |
| | | | | 174/16.3 |
| 8,191,613 B2 * | 6/2012 | Yuan | | H01L 23/4006 |
| | | | | 165/80.3 |
| 8,199,502 B2 * | 6/2012 | Ji | | G06F 1/20 |
| | | | | 361/703 |
| 8,430,152 B2 * | 4/2013 | Liu | | H01L 23/467 |
| | | | | 165/68 |
| 8,567,484 B2 * | 10/2013 | Liu | | H01L 23/467 |
| | | | | 165/80.3 |
| 8,593,814 B2 * | 11/2013 | Ji | | G06F 1/20 |
| | | | | 361/720 |
| 8,622,119 B2 * | 1/2014 | Yang | | H01L 23/4006 |
| | | | | 165/185 |
| D701,179 S * | 3/2014 | Kim | | D13/179 |
| 9,252,073 B2 * | 2/2016 | Yamashita | | H01L 23/3672 |
| 11,910,569 B2 * | 2/2024 | Jheng | | H01L 23/3672 |
| 2007/0121293 A1 * | 5/2007 | Hong | | H01L 23/467 |
| | | | | 257/E23.099 |
| 2009/0073656 A1 * | 3/2009 | Otsuki | | H01L 23/367 |
| | | | | 29/889.3 |
| 2009/0244844 A1 * | 10/2009 | Liao | | H01L 23/4006 |
| | | | | 361/697 |
| 2009/0262505 A1 * | 10/2009 | Lin | | H01L 23/467 |
| | | | | 361/709 |
| 2010/0243219 A1 * | 9/2010 | Yang | | H01L 23/467 |
| | | | | 165/122 |
| 2011/0141700 A1 * | 6/2011 | Liu | | H01L 23/467 |
| | | | | 361/720 |
| 2014/0138067 A1 * | 5/2014 | Yamashita | | H01L 23/3672 |
| | | | | 165/185 |
| 2017/0269647 A1 * | 9/2017 | Chen | | G06F 1/203 |
| 2022/0174839 A1 * | 6/2022 | Jheng | | H01L 23/3672 |

* cited by examiner

HEAT SINK AND HEAT DISSIPATION DEVICE

CROSS-REFERENCE TO RELATED APPLICATIONS

This patent application is a divisional patent application of U.S. patent application Ser. No. 17/167,041 filed on Feb. 3, 2021 and entitled "HEAT SINK AND HEAT DISSIPATION DEVICE", which is a non-provisional application claims priority under 35 U.S.C. § 119(a) on patent application No(s). 109215924 filed in Taiwan, R.O.C. on Dec. 2, 2020, the entire contents of which are hereby incorporated by reference.

TECHNICAL FIELD

The disclosure relates to a heat sink and a heat dissipation device.

BACKGROUND

In era of information explosion, various electronic products are indispensable in the daily life. As technology progresses and develops, the performance of the electronic product have been improved, but the higher performance of the electronic product, the greater heat is produced therefrom. Therefore, the electronic product requires a heat dissipation device to dissipate heat generated by electronic components thereof to maintain and improve the operation. A fan is one of the common means of the heat dissipation device. The fan can blow hot air away to decrease the temperature of the heat sources.

Taking the central processing unit (i.e., CPU) for instance, a typical cooling solution for a CPU is to stack a heat sink on the CPU and place a fan on the heat sink, the heat sink can absorb heat generated by the CPU, and the fan can blow cold air across the heat sink so as to push hot air away. However, this arrangement is exclusive for cooling CPU and is unlikely to contribute effective cooling to other heat sources (e.g., random access memories or chips) around the CPU, and it is unlikely to provide every heat source with a fan and heat sink arrangement due to the cost and limited interior space. Therefore, how to effectively dissipate heat generated from the CPU and the heat sources around the CPU is one of important issues to be solved.

SUMMARY

The disclosure provides a heat sink and a heat dissipation device that are capable of effectively dissipate heat generated by the CPU and other heat sources therearound.

One embodiment of the disclosure provides a heat sink. The heat sink includes a cylindrical body and a plurality of fins. The fins are connected to and protruding from the cylindrical body. At least a part of the plurality of fins each include a first protrusion portion and a second protrusion portion, a distal edge of the first protrusion portion is located farther away from a central axis of the cylindrical body than a distal edge of the second protrusion portion.

Another embodiment of the disclosure provides a heat sink. The heat sink includes a cylindrical body, a first fin assembly, and a second fin assembly. The first fin assembly includes a first mount portion and a plurality of first fins. The first mount portion is mounted on the cylindrical body, and the first fins are connected to and protrude from the first mount portion. The second fin assembly includes a second mount portion and a plurality of second fins. The second mount portion is mounted on the cylindrical body, and the second fins are connected to and protrude from the second mount portion. The first mount portion and the second mount portion are in a coaxial arrangement, and lengths of the first fins are different from lengths of the second fins.

Still another embodiment of the disclosure provides a heat dissipation device. The heat dissipation device includes a heat sink and an airflow generator. The heat sink includes a cylindrical body and a plurality of fins. The fins are connected to and protruding from the cylindrical body. At least a part of the plurality of fins each include a first protrusion portion and a second protrusion portion, a distal edge of the first protrusion portion is located farther away from a central axis of the cylindrical body than a distal edge of the second protrusion portion. The airflow generator is disposed on the heat sink. The first protrusion portion is located closer to the airflow generator than the second protrusion portion.

Yet another embodiment of the disclosure provides a heat dissipation device. The heat dissipation device includes a heat sink and an airflow generator. The heat sink includes a cylindrical body, a first fin assembly, and a second fin assembly. The first fin assembly includes a first mount portion and a plurality of first fins. The first mount portion is mounted on the cylindrical body, and the first fins are connected to and protrude from the first mount portion. The second fin assembly includes a second mount portion and a plurality of second fins. The second mount portion is mounted on the cylindrical body, the second fins are connected to and protrude from the second mount portion. The first mount portion and the second mount portion are in a coaxial arrangement, and lengths of the first fins are larger than lengths of the second fins.

According to the heat sinks and the heat dissipation devices discussed in the above embodiments of the disclosure, the distal edge of the first protrusion portion of each fin is located further away from the central axis of the heat sink than that of the second protrusion portion of the same fin, in other words, the most distal edge of each fin is located further away from the distal edge of the second protrusion portion of the same fin, thus the airflow generated by the airflow generator will be guided to flow in vertical and lateral manner after across the heat sink, distributing the cooling air to the target heat source and other heat sources therearound.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
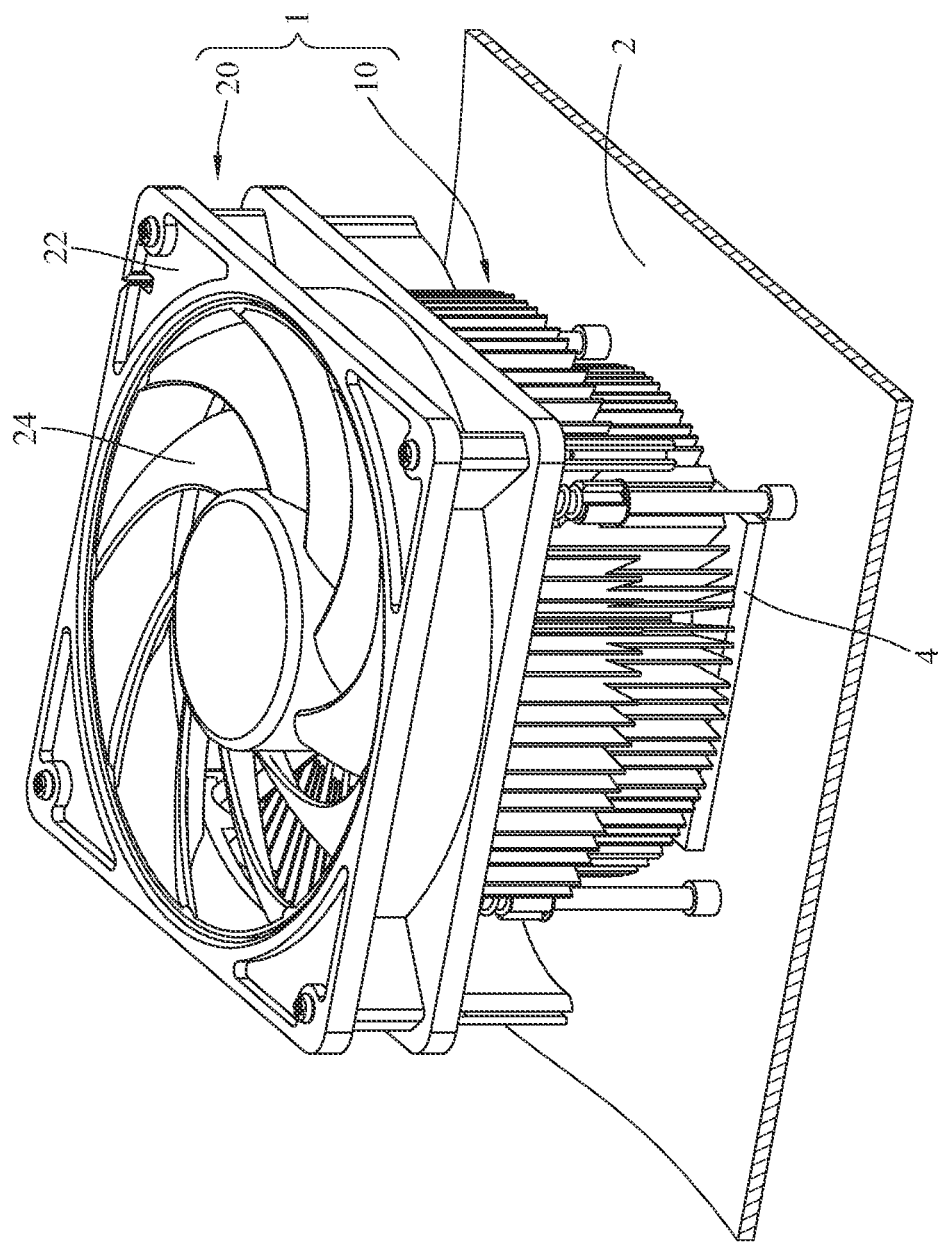
FIG. 1 is a perspective view of a heat dissipation device mounted on a circuit board according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
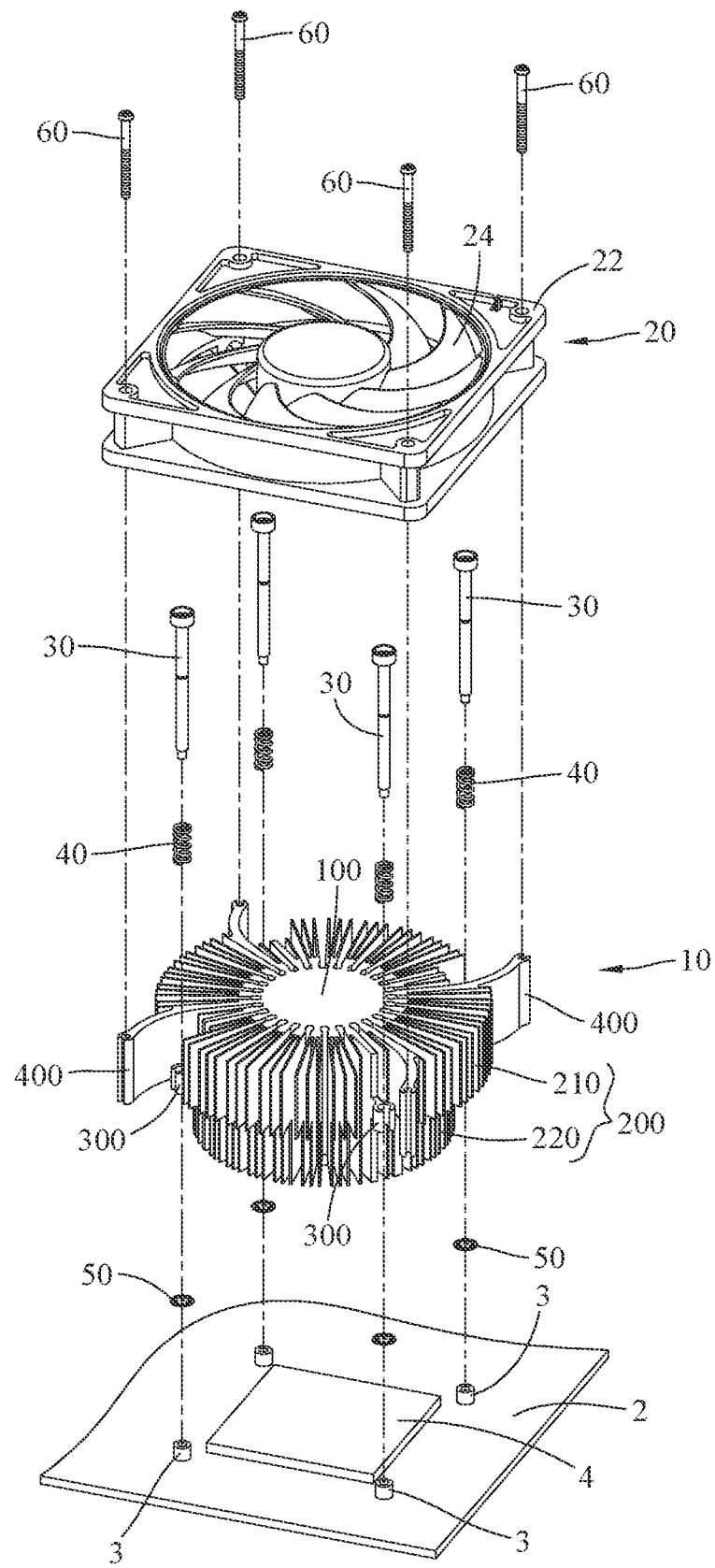
FIG. 2 is an exploded view of the heat dissipation device and the circuit board in FIG. 1.
Figure 3:
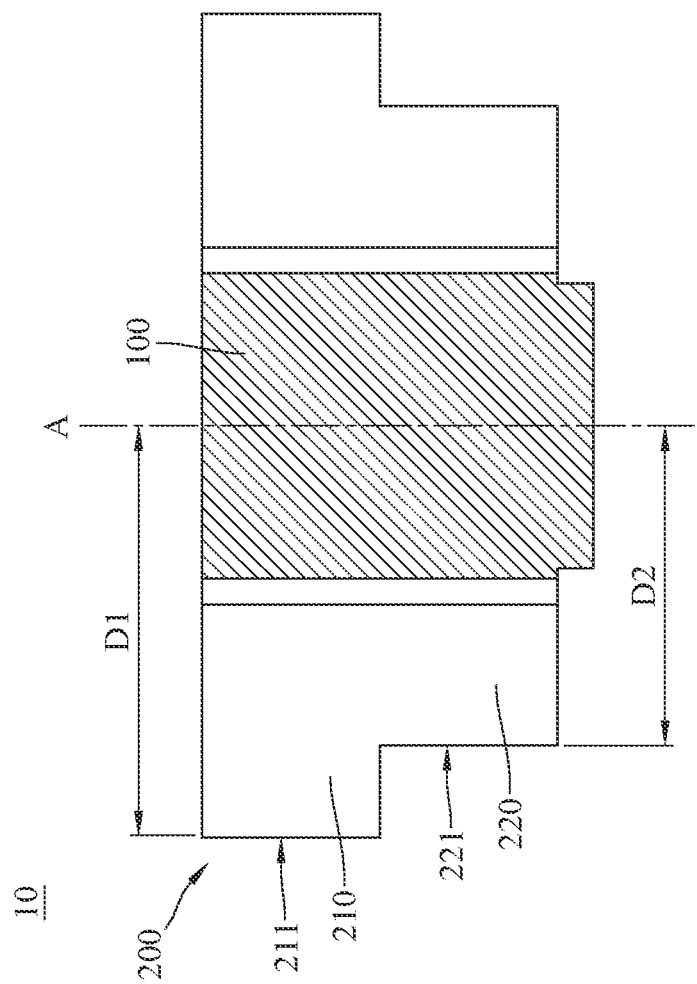
FIG. 3 is a cross-sectional view of a heat sink of heat dissipation device in FIG. 2.

Referring to FIGS. 1 to 3, there are shown a perspective view of a heat dissipation device 1 mounted on a circuit board 2 according to a first embodiment of the disclosure, an exploded view of the heat dissipation device 1 and the circuit board 2 in FIG. 1, and a cross-sectional view of a heat sink 10 of heat dissipation device 1 in FIG. 2.

As shown in FIGS. 1 and 2, the heat dissipation device 1 is configured to be mounted on the circuit board 2. The circuit board 2 has a plurality of mount pillars 3, and there is a heat source 4 disposed on the circuit board 2. The heat source 4 is, for example, a central processing unit or a graphics processing unit.

The heat dissipation device 1 includes a heat sink 10 and an airflow generator 20. The heat sink 10 is, for example, made of gold, silver, copper, iron or any other suitable metal of high thermal conductivity. The heat sink 10 includes a cylindrical body 100 and a plurality of fins 200. The cylindrical body 100 is configured to be thermally in contact with the heat source 4. The heat sink 10 can be made by aluminum extrusion, such that the fins 200 are integrally formed on the cylindrical body 100. The fins 200 are spaced apart from one another and protrude radially outward from the cylindrical body 100. In this embodiment, each of the fins 200 is a flat plate, but the present disclosure is not limited thereto; in some other embodiments, each of the fins may be a curved plate. The airflow generator 20 is, for example, an axial fan. The airflow generator 20 includes a frame 22 and an impeller 24. The frame 22 is mounted on the heat sink 10, and the impeller 24 is rotatably mounted on the frame 22. The rotation of the impeller 24 can generate the airflow across the heat sink 10.

In detail, each of fins 200 includes a first protrusion portion 210 and a second protrusion portion 220. Each of the first protrusion portions 210 has a distal edge 211 located away from the cylindrical body 100, and there is a maximum distance D1 between the distal edge 211 of each of the first protrusion portions 210 and the central axis A of the cylindrical body 100. Similarly, each of the second protrusion portions 220 also has a distal edge 221 located away from the cylindrical body 100, and there is a maximum distance D2 between the distal edge 221 of each of the second protrusion portions 220 and the central axis A of the cylindrical body 100. The distance D1 is larger than the distance D2; that is, the distal edge 211 of each of the first protrusion portions 210 is located farther away from the central axis A of the cylindrical body 100 than the distal edge 221 of each of the second protrusion portions 220, and the distance D2 ranges between 65% and 85% of the distance D1.

In this embodiment, the distal edge 211 of the first protrusion portion 210 and the distal edge 221 of the second protrusion portion 220 are parallel to the central axis A of the cylindrical body 100, but the present disclosure is not limited thereto; in some other embodiments, the distal edge of the first protrusion portion and the distal edge of the second protrusion portion may not be parallel to the central axis of the cylindrical body.

In this embodiment, each of the fins 200 has the arrangement of the first protrusion portion 210 and the second protrusion portion 220, but the present disclosure is not limited thereto; in some other embodiments, only a part of the fins have the arrangement of the first protrusion portion 210 and the second protrusion portion 220, and it will be introduced in the later embodiment.

In this embodiment, the heat dissipation device 1 may further include a plurality of first fasteners 30, a plurality of elastic components 40, and a plurality of stoppers 50. The heat sink 10 may further include a plurality of first mount structures 300. The first mount structures 300 are connected to a part of the first protrusion portions 210. The first mount structure 300 are configured to be mounted to the mount pillars 3 via the first fasteners 30 for fixing the heat sink 10 in position to thermally contact the heat sink 10 with the heat source 4. The elastic components 40 are, for example, compression springs. The elastic components 40 are respectively sleeved on the first fasteners 30. The elastic components 40 are forced to respectively press against sides of the first mount structures 300 located close to the airflow generator 20 by the pressing of the first fasteners 30, ensuring the contact between the heat sink 10 and the heat source 4. The stoppers 50 are respectively mounted on the first fasteners 30 and contacts another sides of the first mount structures 300 located away from the airflow generator 20.

Note that the quantities of the first mount structures 300, the first fasteners 30, the elastic components 40, and the stoppers 50 may be adjusted as required and are not intended to limit the disclosure; in some other embodiments, the quantities of the first mount structure 300, the first fastener 30, the elastic component 40, and the stopper 50 may be one.

In this embodiment, the heat dissipation device 1 may further include a plurality of second fasteners 60. The heat sink 10 may further include a plurality of second mount structures 400. The second mount structure 400 are connected to another part of the first protrusion portions 210. The airflow generator 20 are mounted to the second mount structure 400 via the second fasteners 60, such that the airflow generator 20 is installed on the heat sink 10. In addition, when the airflow generator 20 is disposed on the heat sink 10, the first protrusion portions 210 are located closer to the airflow generator 20 than the second protrusion portions 220; that is, the first protrusion portions 210 are located at an air inlet of the heat sink 10, and the second protrusion portions 220 are located at an air outlet of the heat sink 10.

Note that the quantities of the second mount structures 400 and the second fasteners 60 may be adjusted as required and are not intended to limit the disclosure; in some other embodiments, the quantities of the second mount structure 400 and the second fasteners 60 may be one.

Figure 4:
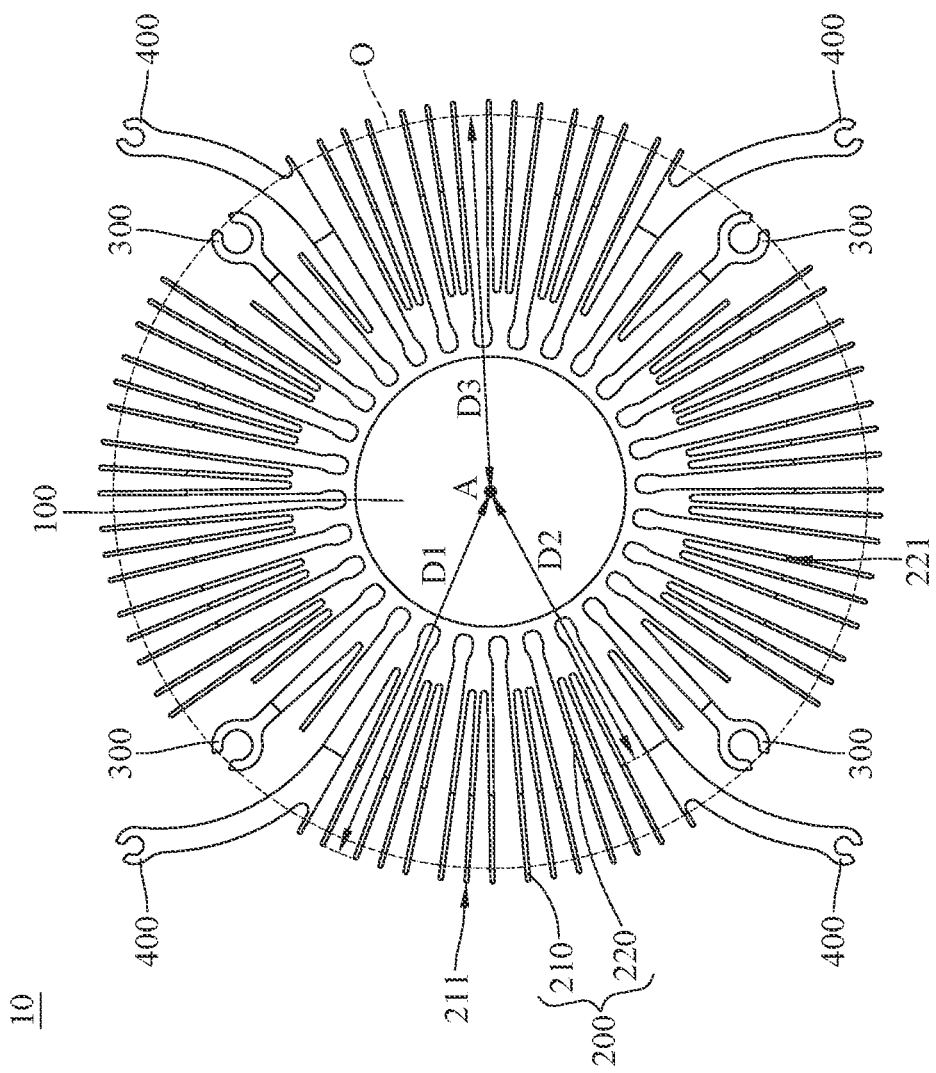
FIG. 4 is a bottom view of the heat sink in FIG. 2.

Referring to FIG. 4, there is shown a bottom view of the heat sink 10 in FIG. 2. In this embodiment, there is a maximum distance D3 between a virtual boundary O of the impeller 24 and the central axis A of the cylindrical body 100, where the virtual boundary O of the impeller 24 is defined by distal edges of blades of the impeller 24 while the impeller 24 are rotating. The distance D1 is equal to or larger than the distance D3, and the distance D2 is smaller than the distance D2.

Figure 5:
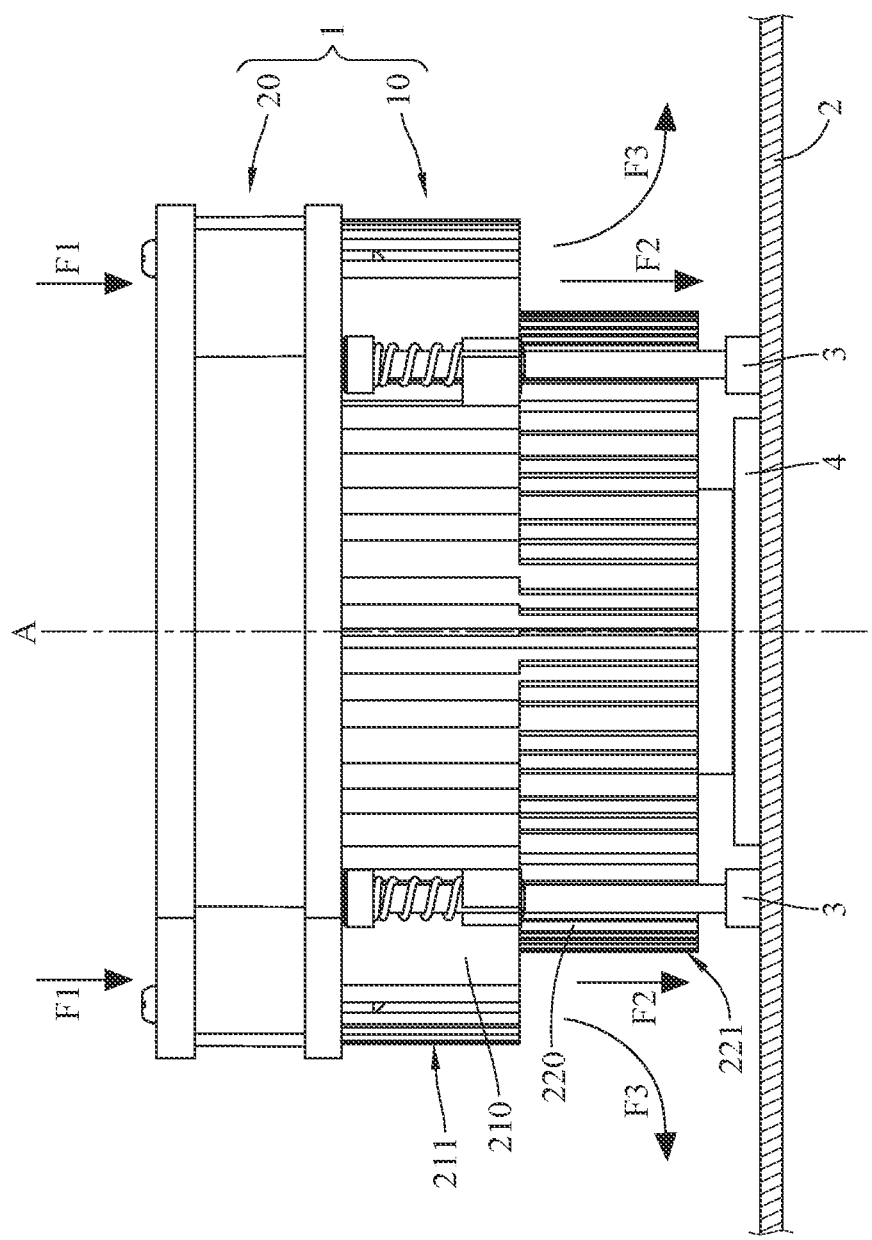
FIG. 5 is a side view of the heat dissipation device mounted on the circuit board in FIG. 1.

Referring to FIG. 5, there is shown a side view of the heat dissipation device 1 mounted on the circuit board 2 in FIG. 1. Since the maximum distance D1 between the distal edge 211 of each of the first protrusion portions 210 and the central axis A of the cylindrical body 100 is larger than the maximum distance D2 between the distal edge 221 of each of the second protrusion portions 220 and the central axis A of the cylindrical body 100, or the maximum distance D2 between the distal edge 221 of each of the second protrusion portions 220 and the central axis A of the cylindrical body 100 is smaller than the maximum distance D3 between the virtual boundary of the impeller 24 and the central axis A of the cylindrical body 100, such that the airflow F1, generated by the airflow generator 20, will be guided to flow in vertical and lateral manner (e.g. airflow F2 in vertical direction and airflow F3 in lateral direction) after across the first protrusion portions 210, and the airflow F3 can be used to cool other heat sources near the heat sources 4. That is, the air across the first protrusion portions 210 can be distributed to the target heat source (i.e., the heat source 4) and other heat sources therearound.

Figure 6:
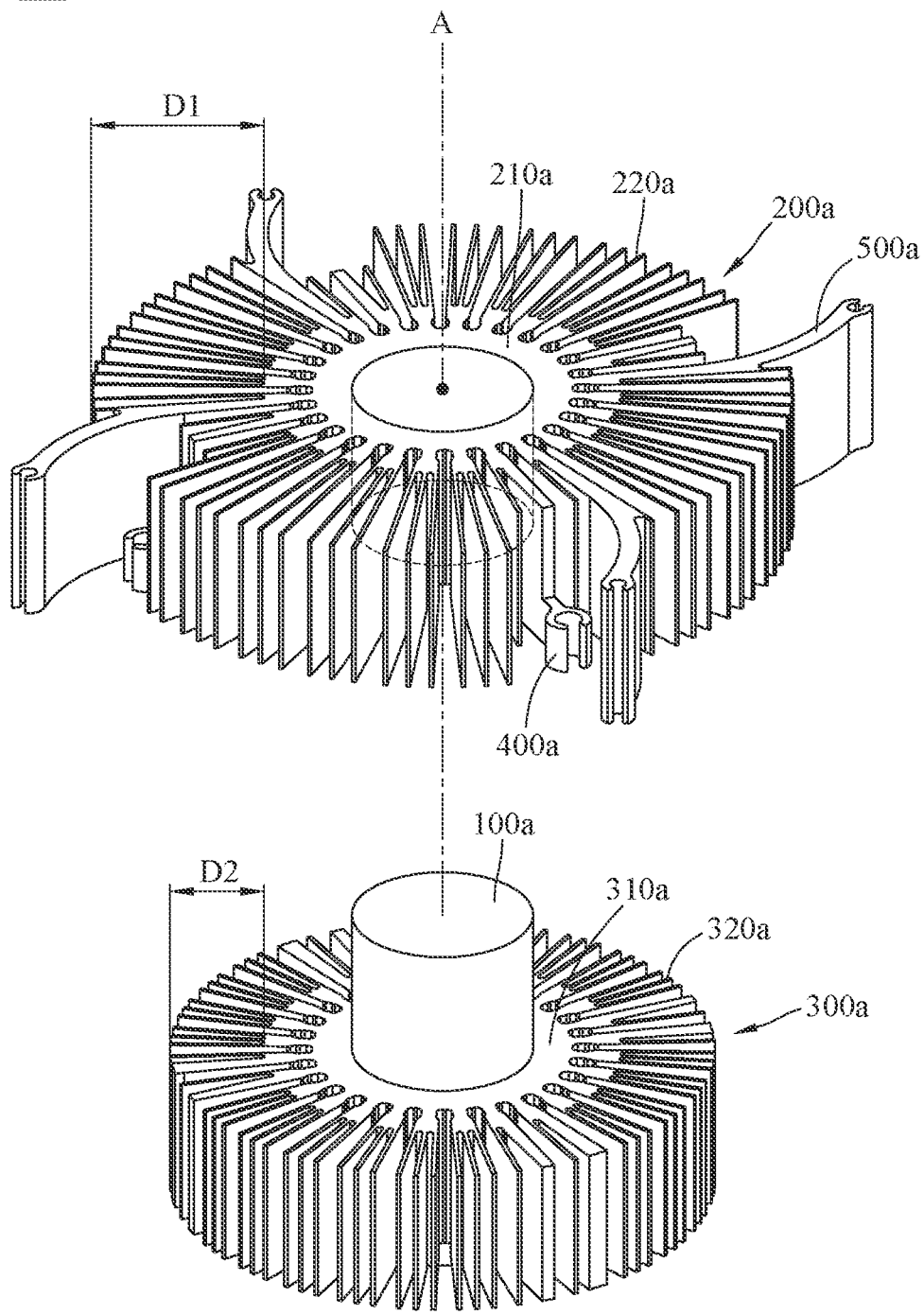
FIG. 6 is an exploded view of a heat sink according to a second embodiment of the disclosure.

It is noted that the configuration of the heat sink used in the disclosure can be modified as required. Referring to FIG. 6, there is shown an exploded view of a heat sink 10a according to a second embodiment of the disclosure. In this embodiment, the heat sink 10a includes a cylindrical body 100a, a first fin assembly 200a, and a second fin assembly 300a. The first fin assembly 200a includes a first mount portion 210a and a plurality of first fins 220a. The first mount portion 210a is, for example, in a ring shape, but the disclosure is not limited thereto. The first mount portion 210a is sleeved on the cylindrical body 100a. The first fins 220a are connected and radially protrude from the first mount portion 210a. The second fin assembly 300a includes a second mount portion 310a and a plurality of second fins 320a. The second mount portion 310a is, for example, in a ring shape, but the disclosure is not limited thereto. The second mount portion 310a is sleeved on the cylindrical body 100a. The second fins 320a are connected to and radially protrude from the second mount portion 310a. Since the first mount portion 210a and the second mount portion 310a both are sleeved on the cylindrical body 100a, the first mount portion 210a and the second mount portion 310a are in a coaxial arrangement. In addition, the first fins 220a each have a length D1, and the second fins 320a each have a length D2. The length D1 of each of the first fins 220a is different from the length D2 of each of the second fins 320a. In specific, the length D1 of each of the first fins 220a is larger than the length D2 of each of the second fins 320a, such that the airflow F1, generated by the airflow generator 20, will be guided to flow in vertical and lateral manner after across the first fin assembly 200a.

In this embodiment, the heat sink 10a may further include a plurality of first mount structures 400a and a plurality of second mount structures 500a. The first mount structures 400a are connected to a part of the first fins 220a, and the second mount structure 500a are connected to another part of first fins 220a. The first mount structures 400a and the second mount structures 500a have the same structures as that of the first mount structures 300 and the second mount structures 400 of the previous embodiment, thus the following paragraphs will not repeatedly introduce them.

In this embodiment, the first fins 220a have the same length D1, but the present disclosure is not limited thereto; in some other embodiments, at least two of the first fins may be different in length. Similarly, in this embodiment, the second fins 320a have the same length D2, but the present disclosure is not limited thereto; in some other embodiments, at least two of the second fins may be different in length.

In this embodiment, the first fins 220a and the second fins 320a are flat plates, but the disclosure is not limited thereto; in some other embodiments, the first fins and the second fins may be curved plates.

Figure 7:
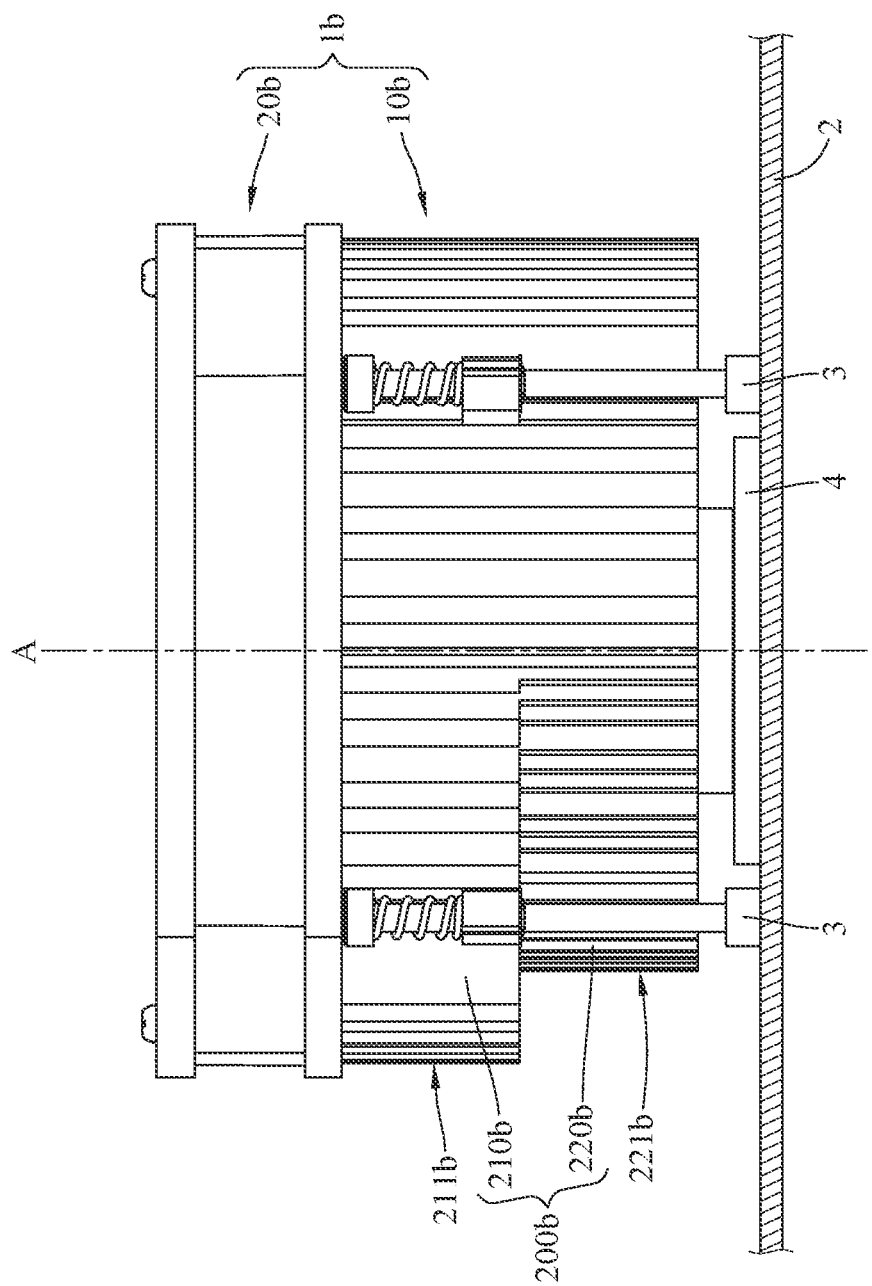
FIG. 7 is a side view of a heat dissipation device mounted on a circuit board according to a third embodiment of the disclosure.
Figure 8:
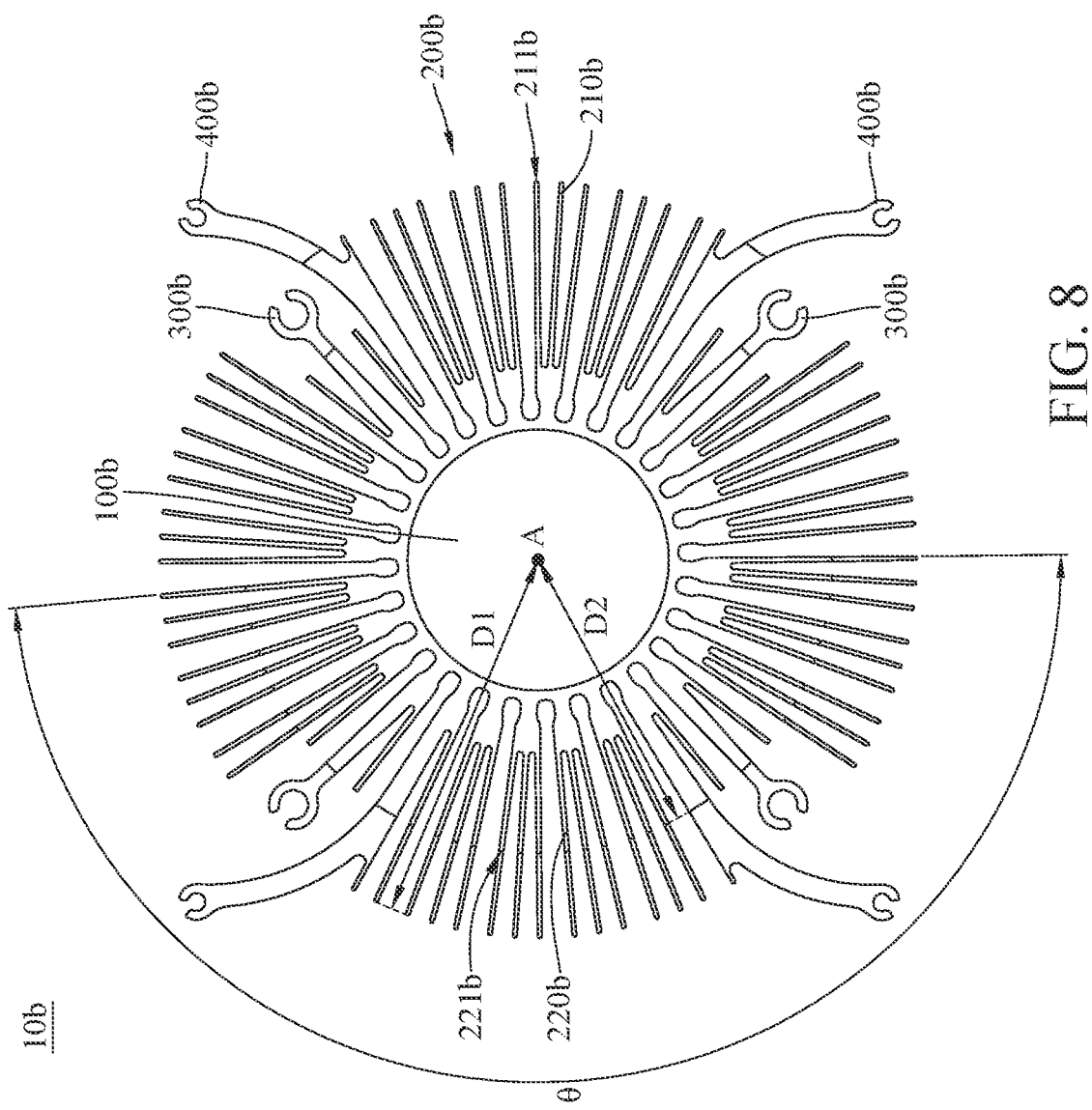
FIG. 8 is a bottom view of a heat sink of the heat dissipation device in FIG. 7.

It is noted that the configuration of the fin of the disclosure can be modified as required. Referring to FIGS. 7 and 8, there are shown a side view of a heat dissipation device 1b mounted on a circuit board 2 according to a third embodiment of the disclosure and a bottom view of a heat sink 10b of the heat dissipation device 1b in FIG. 7. In this embodiment, the heat dissipation device 1b includes a heat sink 10b and an airflow generator 20b. The airflow generator 20b has the same structure as the airflow generator 20a, thus the following paragraphs will only detailedly introduce the heat sink 10b.

The heat sink 10b includes a cylindrical body 100b and a plurality of fins 200b. The fins 200b are connected and radially protrude from the cylindrical body 100b, and only a part of the fins 200b have the arrangement of a first protrusion portion 210b and a second protrusion portion 220b of different lengths. In this embodiment, the fins 200b that have the arrangement of the first protrusion portion 210b and the second protrusion portion 220b occupy a range substantially equal to a half area of the circle formed by all of the fins 200b of the heat sink 10b, but the disclosure is not limited thereto; in some other embodiments, the fins that have the arrangement of the first protrusion portion and the second protrusion portion may occupy ¼ area of the circle formed by all of the fins.

Figure 9:
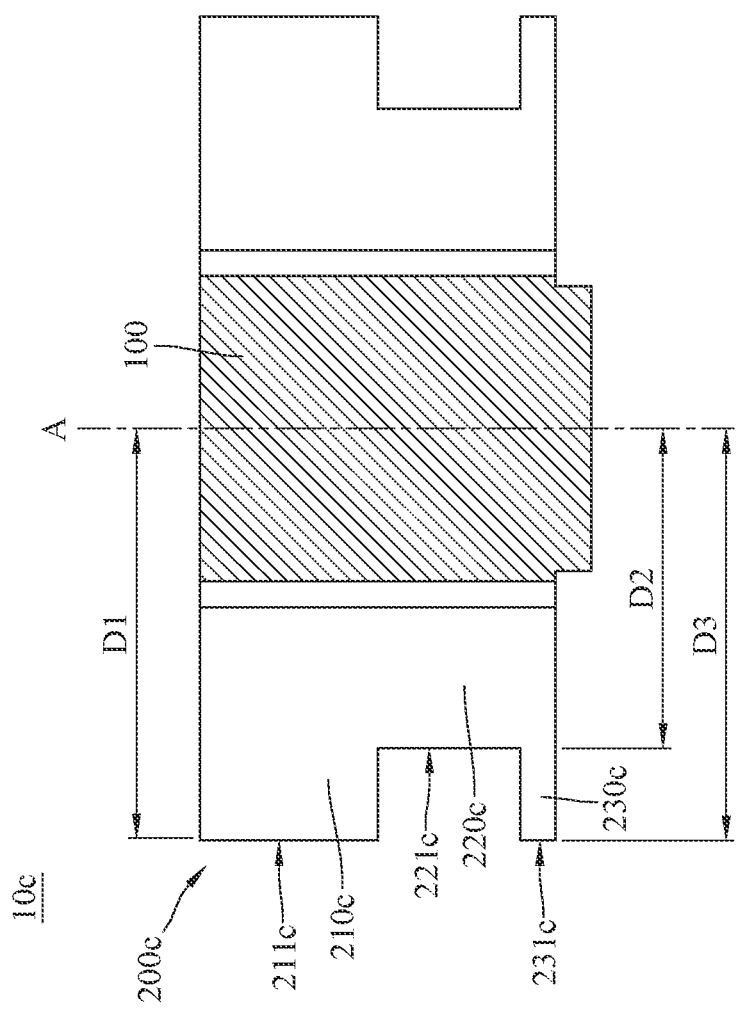
FIG. 9 is a cross-sectional view of a heat sink according to a fourth embodiment of the disclosure.

Referring to FIG. 9, there is shown a cross-sectional view of a heat sink 10c according to a fourth embodiment of the disclosure. In this embodiment, the heat sink 10c includes a cylindrical body 100 and a plurality of fins 200c. Each of the fins 200c includes a first protrusion portion 210c, a second protrusion portion 220c, and a third protrusion portion 230c. Each of the first protrusion portions 210c has a distal edge 211c located away from the cylindrical body 100c, and there is a maximum distance D1 between the distal edge 211c of each of the first protrusion portions 210c and a central axis A of the cylindrical body 100. Also, each of the second protrusion portions 220c has a distal edge 221c located away from the cylindrical body 100, and there is a maximum distance D2 between the distal edge 221c of each of the second protrusion portions 220c and the central axis A of the cylindrical body 100. Furthermore, each of the third protrusion portions 230c has a distal edge 231c located away from the cylindrical body 100, and there is also a maximum distance D3 between the distal edge 231c of each of the third protrusion portions 230c and the central axis A of the cylindrical body 100. The distances D1 and D3 are larger than the distance D2.

In this embodiment, the maximum distance D1 between the distal edge 211c of each of the first protrusion portions 210c and the central axis of the cylindrical body 100 is equal to the maximum distance D3 between the distal edge 231c of each of the third protrusion portions 230c and the central axis A of the cylindrical body 100, but the present disclosure is not limited thereto; in some other embodiments, the maximum distance between the distal edge of each of the first protrusion portions and the central axis of the cylindrical body may be unequal to the maximum distance between the distal edge of each of the third protrusion portions and the central axis of the cylindrical body.

In this embodiment, the second protrusion portions 220c are located between the first protrusion portions 210c and the third protrusion portions 230c, and the first protrusion portions 210c are configured to be located closer to the airflow generator 20 than the other, such that the second protrusion portions 220c are not located at the air outlet of the heat sink 10c.

In this embodiment, the heat sink 10c is made of a single piece, but the present disclosure is not limited thereto; in some other embodiment, the heat sink may be formed by the installation of a cylindrical body and three fin assemblies (e.g., similar to the heat sink 10a formed by the installation of the cylindrical body 100a and the fin assemblies 200a and 300a of FIG. 6).

According to the heat sinks and the heat dissipation devices discussed in the above embodiments of the disclosure, the distal edge of the first protrusion portion of each fin is located further away from the central axis of the heat sink than that of the second protrusion portion of the same fin, in other words, the most distal edge of each fin is located further away from the distal edge of the second protrusion portion of the same fin, thus the airflow generated by the airflow generator will be guided to flow in vertical and lateral manner after across the heat sink, distributing the cooling air to the target heat source and other heat sources therearound.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat sink, comprising:
a cylindrical body;
a first fin assembly, comprising a first mount portion and a plurality of first fins, wherein the first mount portion is mounted on the cylindrical body, and the plurality of first fins are connected to and protrude from the first mount portion; and
a second fin assembly, comprising a second mount portion and a plurality of second fins, wherein the second mount portion is mounted on the cylindrical body, and the plurality of second fins are connected to and protrude from the second mount portion;
wherein the first mount portion and the second mount portion are in a coaxial arrangement, and lengths of the plurality of first fins are different from lengths of the plurality of second fins;
wherein the first mount portion, the second mount portion and the cylindrical body are made of three pieces, and the first mount portion and the second mount portion are arranged side by side along a central axis of the cylindrical body.

2. The heat sink according to claim 1, wherein at least two of the plurality of first fins are different in length.

3. The heat sink according to claim 2, wherein at least two of the plurality of second fins are different in length.

4. The heat sink according to claim 1, wherein the first mount portion and the second mount portion are in a ring shape.

5. The heat sink according to claim 1, wherein the plurality of first fins and the plurality of second fins are flat plates.

6. A heat dissipation device, comprising:
a heat sink, comprising:
a cylindrical body; and
a plurality of fins, connected to and protrude from the cylindrical body, wherein at least a part of the plurality of fins each comprises a first protrusion portion and a second protrusion portion, a distal edge of the first protrusion portion is located farther away from a central axis of the cylindrical body than a distal edge of the second protrusion portion; and
an airflow generator, disposed on the heat sink, wherein the first protrusion portion is located closer to the airflow generator than the second protrusion portion;
wherein the heat dissipation device further comprises at least one first fastener, the heat sink further comprises at least one first mount structure connected to the first protrusion portion of one of the part of the plurality of fins, and the at least one first mount structure is configured to be mounted to a circuit board via the at least one first fastener;
wherein the heat dissipation device further comprises at least one second fastener, the heat sink further comprises at least one second mount structure connected to the first protrusion portion of one of the part of the plurality of fins, and the airflow generator is configured to be installed on the at least one second mount structure via the at least one second fastener;
wherein a length that the at least one second mount structure protrudes from the distal edge of the first protrusion portion is greater than a distance between the distal edge of the first protrusion portion and the distal edge of the second protrusion portion.

7. The heat dissipation device according to claim 6, wherein the airflow generator is an axial fan.

8. The heat dissipation device according to claim 7, wherein the airflow generator comprises a frame and an impeller, the impeller is rotatably disposed on the frame, a maximum distance between the distal edge of the first protrusion portion and the central axis of the cylindrical body is equal to or larger than a maximum distance between a virtual boundary of the impeller and the central axis of the cylindrical body, and a maximum distance between the distal edge of the second protrusion portion and the central axis of the cylindrical body is smaller than the maximum distance between the virtual boundary of the impeller and the central axis of the cylindrical body.

9. The heat dissipation device according to claim 6, further comprising at least one elastic component and at least one stopper, wherein the at least one elastic component presses against a side of the first mount structure located close to the airflow generator, the at least one stopper is mounted on the at least one first fastener and located at another side of the at least one first mount structure located away from the airflow generator.

10. A heat dissipation device, comprising:
a heat sink, comprising:
a cylindrical body;
a first fin assembly, comprising a first mount portion and a plurality of first fins, wherein the first mount portion is mounted on the cylindrical body, and the plurality of first fins are connected to and protrude from the first mount portion; and a second fin assembly, comprising a second mount portion and a plurality of second fins, wherein the second mount portion is mounted on the cylindrical body, the plurality of second fins are connected to and protrude from the second mount portion, the first mount portion and the second mount portion are in a coaxial arrangement, and lengths of the plurality of first fins are larger than lengths of the plurality of second fins; and an airflow generator, disposed on the heat sink, wherein the plurality of first fins are located closer to the airflow generator than the plurality of second fins;

wherein the first mount portion, the second mount portion and the cylindrical body are made of three pieces, and the first mount portion and the second mount portion are arranged side by side along a central axis of the cylindrical body.

11. The heat dissipation device according to claim 10, wherein the airflow generator is an axial fan.

12. The heat dissipation device according to claim 11, wherein the airflow generator comprises a frame and an impeller, the impeller is rotatably disposed on the frame, a maximum distances between a distal edge of each of the plurality of first fins and the central axis of the cylindrical body is equal to or larger than a maximum distance between a virtual boundary of the impeller and the central axis of the cylindrical body, and a maximum distance between a distal edge of each of the plurality of second fins and the central axis of the cylindrical body is smaller than the maximum distance between the virtual boundary of the impeller and the central axis of the cylindrical body.

13. The heat dissipation device according to claim 10, further comprising at least one first fastener, wherein the heat sink further comprises at last one first mount structure connected to one of the plurality of first fins, and the first mount structure is configured to be mounted to a circuit board via the at least one first fastener.

14. The heat dissipation device according to claim 13, further comprising at least one second fastener, wherein the heat sink further comprises at least one second mount structure connected to one of the plurality of first fins, and the airflow generator is configured to be installed on the at least one second mount structure via the at least one second fastener.

* * * * *